(12) United States Patent
Rappoport et al.

(10) Patent No.: US 11,700,760 B2
(45) Date of Patent: Jul. 11, 2023

(54) ELECTRONIC DEVICES HAVING DISPLAYS WITH OPENINGS

(71) Applicant: Apple Inc., Cupertino, CA (US)

(72) Inventors: Benjamin M. Rappoport, Santa Barbara, CA (US); Jeremy C. Franklin, San Francisco, CA (US); Fletcher R. Rothkopf, Los Altos, CA (US); Scott A. Myers, Saratoga, CA (US); Richard P. Howarth, San Francisco, CA (US); Julian Hoenig, Lisbon (PT); Christopher Stringer, Woodside, CA (US); John P. Ternus, Los Altos Hills, CA (US); Stephen Brian Lynch, Portola Valley, CA (US)

(73) Assignee: Apple Inc., Cupertino, CA (US)

( * ) Notice: Subject to any disclaimer, the term of this patent is extended or adjusted under 35 U.S.C. 154(b) by 327 days.

(21) Appl. No.: 17/115,547

(22) Filed: Dec. 8, 2020

(65) Prior Publication Data

US 2021/0091146 A1 Mar. 25, 2021

Related U.S. Application Data

(63) Continuation of application No. 16/745,185, filed on Jan. 16, 2020, now Pat. No. 10,879,318, which is a
(Continued)

(51) Int. Cl.
*G06F 1/16* (2006.01)
*H10K 59/60* (2023.01)
(Continued)

(52) U.S. Cl.
CPC .............. *H10K 59/60* (2023.02); *G02B 5/208* (2013.01); *G02B 27/01* (2013.01); *G06F 1/169* (2013.01); *G06F 1/1626* (2013.01); *G06F 1/1637* (2013.01); *G06F 1/1641* (2013.01); *G06F 1/1686* (2013.01); *G06F 1/1688* (2013.01);
(Continued)

(58) Field of Classification Search
CPC .................................................. G06F 1/1637
See application file for complete search history.

(56) References Cited

U.S. PATENT DOCUMENTS 6,061,463 A 5/2000 Metz et al.
7,382,890 B2 6/2008 Saiki et al.
(Continued)

*Primary Examiner* — Edmond C Lau
(74) *Attorney, Agent, or Firm* — Treyz Law Group, P.C.; G. Victor Treyz; Kendall P. Woodruff

(57) ABSTRACT

An electronic device may have a display. The display may have an active region in which display pixels are used to display images. The display may have one or more openings and may be mounted in a housing associated with the electronic device. An electronic component may be mounted in alignment with the openings in the display. The electronic component may include a camera, a light sensor, a light-based proximity sensor, status indicator lights, a light-based touch sensor array, a secondary display that has display pixels that may be viewed through the openings, antenna structures, a speaker, a microphone, or other acoustic, electromagnetic, or light-based component. One or more openings in the display may form a window through which a user of the device may view an external object. Display pixels in the window region may be used in forming a heads-up display.

20 Claims, 15 Drawing Sheets

Related U.S. Application Data continuation of application No. 16/203,410, filed on Nov. 28, 2018, now Pat. No. 10,546,901, which is a continuation of application No. 16/179,713, filed on Nov. 2, 2018, now Pat. No. 10,431,636, which is a continuation of application No. 15/812,884, filed on Nov. 14, 2017, now Pat. No. 10,121,831, which is a continuation of application No. 15/402,009, filed on Jan. 9, 2017, now Pat. No. 9,825,103, which is a continuation of application No. 14/612,222, filed on Feb. 2, 2015, now Pat. No. 9,543,364, which is a continuation of application No. 13/273,851, filed on Oct. 14, 2011, now Pat. No. 8,947,627.

(51) Int. Cl.

| | | |
|---|---|---|
| *G06F 3/01* | (2006.01) | |
| *H10K 59/40* | (2023.01) | |
| *H10K 77/10* | (2023.01) | |
| *G02B 27/01* | (2006.01) | |
| *G06F 3/042* | (2006.01) | |
| *G06F 3/044* | (2006.01) | |
| *G09G 3/3208* | (2016.01) | |
| *H04R 1/02* | (2006.01) | |
| *G02B 5/20* | (2006.01) | |

(52) U.S. Cl.
CPC ............ *G06F 1/1698* (2013.01); *G06F 3/011* (2013.01); *G06F 3/042* (2013.01); *G06F 3/044* (2013.01); *G09G 3/3208* (2013.01); *H04R 1/028* (2013.01); *H05K 999/99* (2013.01); *H10K 59/40* (2023.02); *H10K 77/111* (2023.02); *G02B 2027/014* (2013.01); *G02B 2027/0138* (2013.01); *G06F 2203/04101* (2013.01); *G06F 2203/04108* (2013.01); *G09G 2320/0626* (2013.01); *G09G 2360/144* (2013.01); *H04R 2499/15* (2013.01)

(56) References Cited

U.S. PATENT DOCUMENTS

| | | | |
|---|---|---|---|
| 7,450,105 | B2 | 11/2008 | Nakamura et al. |
| 7,804,493 | B2 | 9/2010 | Gettemy |
| 8,330,909 | B2 | 12/2012 | Yoshida et al. |
| 8,701,997 | B2 | 4/2014 | Dorsey et al. |
| 8,724,304 | B2 | 5/2014 | Raff et al. |
| 8,947,627 | B2 | 2/2015 | Rappoport et al. |
| 9,531,970 | B2 | 12/2016 | Haji-Khamneh et al. |
| 9,543,364 | B2 | 1/2017 | Rappoport et al. |
| 9,825,103 | B2 | 1/2017 | Rappoport et al. |
| 9,578,763 | B1 | 2/2017 | Wade |
| 2008/0273014 | A1 | 11/2008 | Lowles et al. |
| 2010/0115407 | A1* | 5/2010 | Kim ................. G06F 3/0488 715/708 |
| 2010/0165267 | A1 | 7/2010 | Yoshida et al. |
| 2011/0195758 | A1 | 8/2011 | Damale et al. |
| 2011/0210825 | A1 | 9/2011 | Murakami et al. |
| 2011/0255850 | A1* | 10/2011 | Dinh ................. H05K 1/0203 396/176 |
| 2016/0307542 | A1 | 10/2016 | Zheng et al. |

* cited by examiner

ELECTRONIC DEVICES HAVING DISPLAYS WITH OPENINGS

This application is a continuation of U.S. patent application Ser. No. 16/745,185, filed Jan. 16, 2020, which is a continuation of U.S. patent application Ser. No. 16/203,410, now U.S. Pat. No. 10,546,901, filed Nov. 28, 2018, which is a continuation of U.S. patent application Ser. No. 16/179,713, filed Nov. 2, 2018, now U.S. Pat. No. 10,431,636, which is a continuation of U.S. patent application Ser. No. 15/812,884, filed Nov. 14, 2017, now U.S. Pat. No. 10,121,831, which is a continuation of U.S. patent application Ser. No. 15/402,009, filed Jan. 9, 2017, now U.S. Pat. No. 9,825,103, which is a continuation of U.S. patent application Ser. No. 14/612,222, filed Feb. 2, 2015, now U.S. Pat. No. 9,543,364, which is a continuation of U.S. patent application Ser. No. 13/273,851, filed Oct. 14, 2011, now U.S. Pat. No. 8,947,627, all of which are hereby incorporated by reference herein in their entireties.

BACKGROUND

This relates to electronic devices and, more particularly, to electronic devices with displays.

Cellular telephones and other portable devices often contain displays. Displays often occupy relatively large portions of an electronic device. For example, in an electronic device cellular telephone or tablet computer, a display may occupy the entire front face of the device.

In many device configurations such as those in which displays occupy large portions of a device, it can be challenging to accommodate device components within the device. For example, a display may present an obstacle to the installation and operation of device components. Unless care is taken, a designer may be forced to make aesthetically unappealing design choices or may need to install device components using awkward or bulky arrangements.

It would therefore be desirable to be able to provide improved arrangements for electronic devices with displays.

SUMMARY

An electronic device may have a display. The display may have an active region in which display pixels are used to display images. The display may be formed from a flexible display substrate such as an organic light-emitting diode display substrate or other display layers.

The display may have one or more openings. The openings may be organized in an array having rows and columns. The openings may be located in the active portion of the display.

The display may be mounted in a housing associated with the electronic device. An electronic component may be mounted in alignment with the one or more openings in the display. Signals associated with the electronic component may pass through the openings. The signals may include acoustic signals, electromagnetic signals such as radio-frequency electromagnetic signals, and light.

The electronic component may be a structure that uses light such as a camera, a light sensor, a light-based proximity sensor, a status indicator light, a light-based touch sensor array, or a secondary display that has display pixels that may be viewed through the openings.

The electronic component may also be a structure that uses radio-frequency signals such as an antenna. Antenna structures may, for example, include a near field antenna or other antenna structures.

The electronic component may be an acoustic component such as a microphone or speaker. A microphone may receive acoustic signals through the openings. Sound from a speaker may be emitted through the openings.

One or more openings in the display may form a window through which a user of the device may view an external object. Display pixels in the portion of the display in which the window is formed may be used in forming a heads-up display. With this type of configuration, the electronic device may display an image for the user using the display pixels in the window region while the user simultaneously views the external object through the window region.

Further features of the invention, its nature and various advantages will be more apparent from the accompanying drawings and the following detailed description of the preferred embodiments.

DETAILED DESCRIPTION

Figure 1:
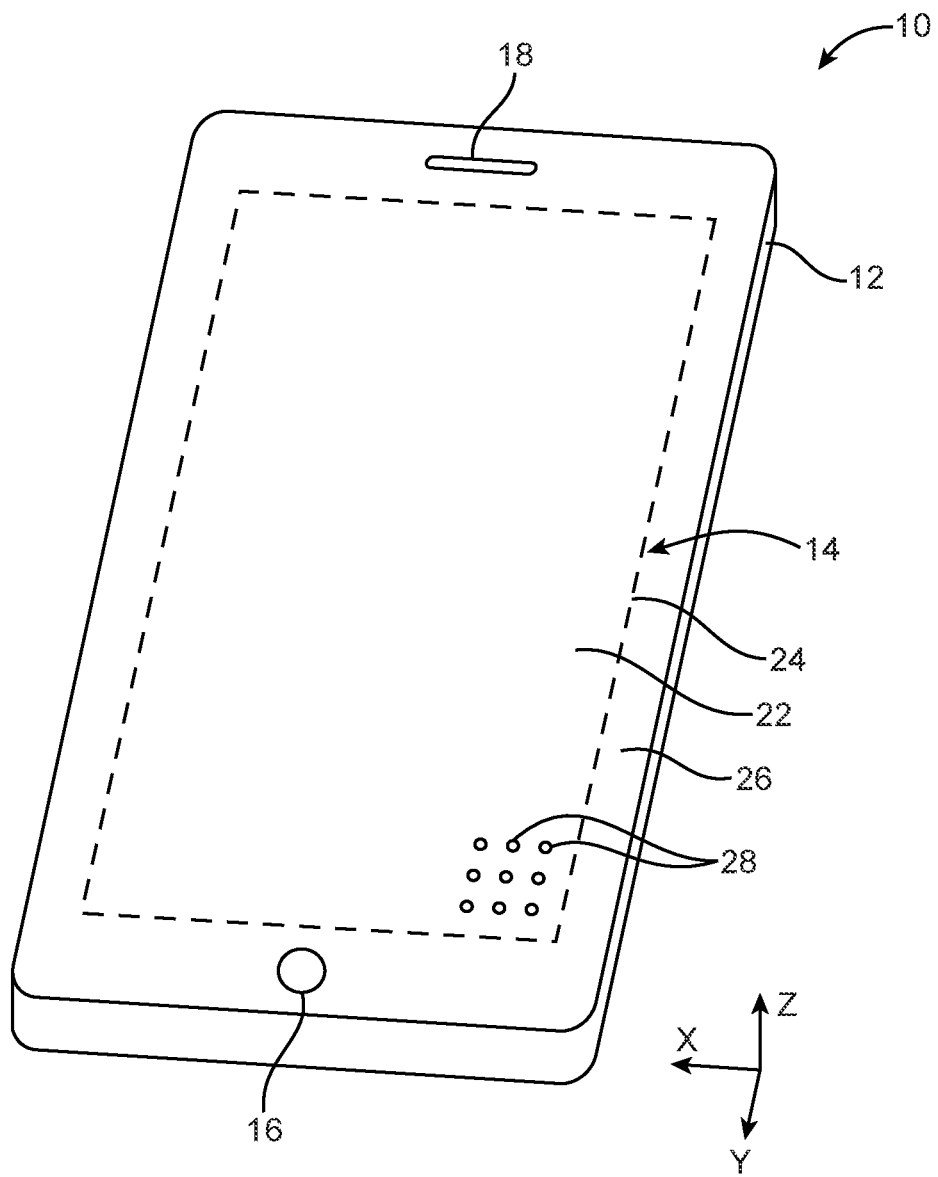
FIG. 1 is a perspective view of an illustrative electronic device with a display having an opening in accordance an embodiment of the present invention.

Electronic devices such as device 10 of FIG. 1 may be provided with displays. A display in a device such as device 10 may have one or more openings. The openings may be used to allow signals to pass through the display.

Device 10 of FIG. 1 may be a portable computer, a tablet computer, a computer monitor, a handheld device, global positioning system equipment, a gaming device, a cellular telephone, portable computing equipment, or other electronic equipment.

Device 10 may include a housing such as housing 12. Housing 12, which may sometimes be referred to as a case, may be formed of plastic, glass, ceramics, fiber composites, metal (e.g., stainless steel, aluminum, etc.), other suitable materials, or a combination of these materials.

Housing 12 may be formed using an unibody configuration in which some or all of housing 12 is machined or molded as a single structure or may be formed using multiple structures (e.g., an internal frame structure, one or more structures that form exterior housing surfaces, etc.).

In some configurations, housing 12 may be formed using front and rear housing structures that are substantially planar. For example, the rear of device 10 may be formed from a planar housing structure such as a planar glass member, a planar plastic member, a planar metal structure, or other substantially planar structure. The edges (sidewalls) of housing 12 may be straight (vertical) or may be curved (e.g., housing 12 may be provided with sidewalls formed from rounded extensions of a rear planar housing wall).

As shown in FIG. 1, the front of device 10 may include a display such as display 14. Display 14 may, for example, be a touch screen that incorporates capacitive touch electrodes or a touch sensor formed using other types of touch technology (e.g., resistive touch, light-based touch, acoustic touch, force-sensor-based touch, etc.). Display 14 may include pixels formed from light-emitting diodes (LEDs), organic LEDs (OLEDs), plasma cells, electronic ink elements, liquid crystal display (LCD) components, or other suitable display pixel structures.

Display 14 may have an active region and an inactive region. Active region 22 of display 14 may lie within rectangular boundary 24. Within active region 22, display pixels such as liquid crystal display pixels, organic light-emitting diode display pixels, or other display pixels may display images for a user of device 10. Active display region 22 may be surrounded by an inactive region such as inactive region 26. Inactive region 26 (a portion of display 14 that is devoid of display pixels) may have the shape of a rectangular ring surrounding active region 22 and rectangular boundary 24 (as an example). If desired, the width of inactive region 26 may be minimized by using a flexible display layer to implement display 14 (e.g., a flexible organic light-emitting-diode display layer) and by bending edges of the flexible display layer that are associated with inactive region 26 downwards away from the exposed face of display 14.

Device 10 may include input-output ports, buttons, sensors, status indicator lights, speakers, microphones, and other input-output components. As shown in FIG. 1, for example, device 10 may include one or more openings in inactive region 26 of display 14. For example, device 10 may have an opening in inactive region 26 to accommodate button 16 and an opening in inactive regions 26 to accommodate speaker port 18.

One or more openings such as openings 28 may also be formed in active region 22 of display 14. For example, in a display such as an organic light-emitting-diode display, display 14 may be formed from a polymer substrate such as a polyimide substrate on which thin-film transistors, organic light-emitting material, and a sealant layer have been deposited. With this type of display arrangement, display 14 may have a front surface formed by the outermost layer of sealant and a rear surface formed by the polymer substrate. Openings 28 may pass through the entirety of the display from the front surface to the rear surface (e.g., in active region 22 of display 14). Displays with other types of layers may likewise have openings 28 that pass through the entirety of the display.

Openings 28 may allow signals to pass through display 14. These signals may include, for example, electromagnetic signals such as radio-frequency electromagnetic signals, acoustic signals, and light. In the example of FIG. 1, openings 28 have been formed in an array having rows and columns of multiple openings. This is merely illustrative. There may be one opening in display 14, two openings in display 14, ten or more openings in display 14, one hundred or more openings in display 14, one thousand or more openings in display 14, or any other suitable number of openings. Openings 28 may, for example, be formed in active display region 22. Display 14 may also be provided with openings such as opening 28 that are located in inactive region 26.

Figure 2:
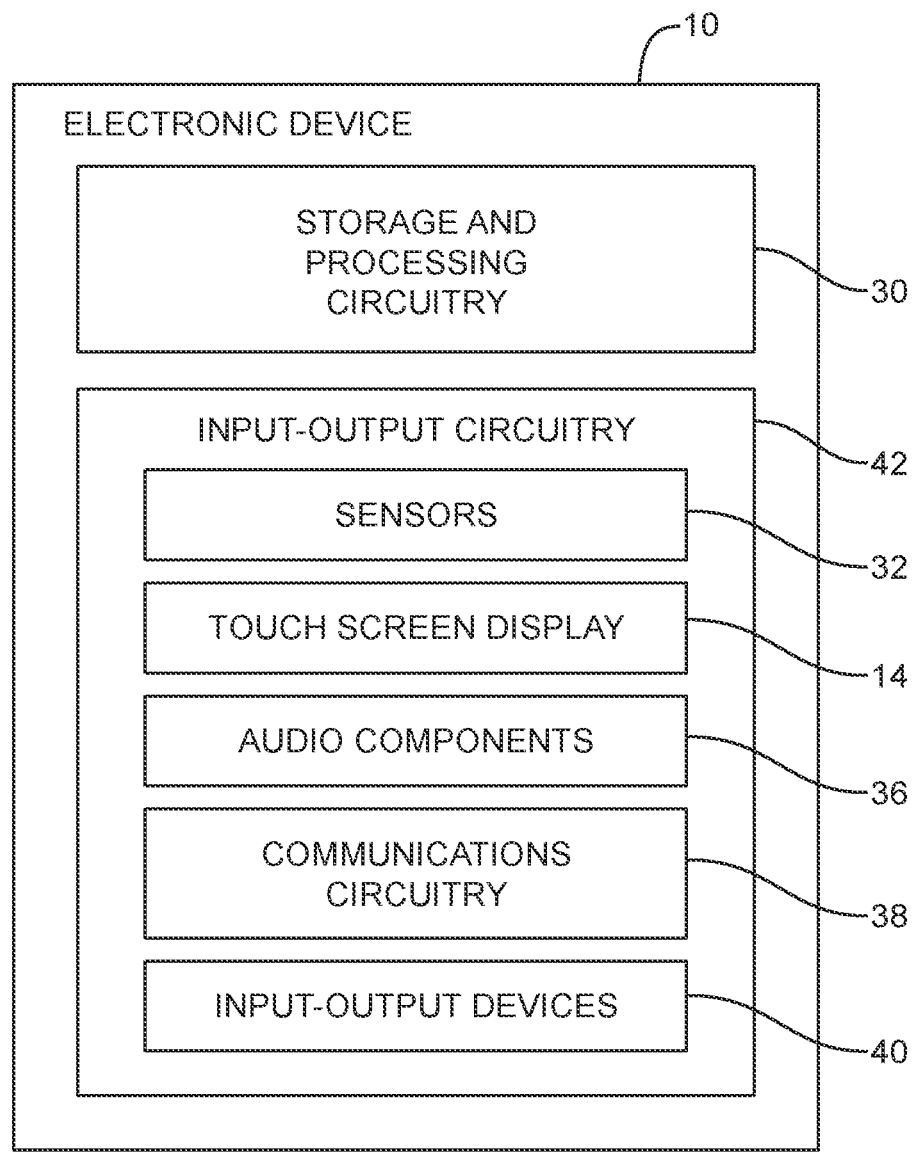
FIG. 2 is a schematic diagram of an illustrative electronic device having a display with an opening in accordance with an embodiment of the present invention.

A schematic diagram of an illustrative electronic device such as electronic device 10 of FIG. 1 is shown in FIG. 2. As shown in FIG. 2, electronic device 10 may include control circuitry such as storage and processing circuitry 30. Storage and processing circuitry 30 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in storage and processing circuitry 30 may be used to control the operation of device 10. This processing circuitry may be based on one or more microprocessors, microcontrollers, digital signal processors, baseband processors, power management units, audio codec chips, application specific integrated circuits, display driver integrated circuits, etc.

Storage and processing circuitry 30 may be used to run software on device 10 such as internet browsing applications, voice-over-internet-protocol (VOIP) telephone call applications, email applications, media playback applications, operating system functions, etc. The software may be used to implement control operations such as image acquisition operations using a camera, ambient light measurements using an ambient light sensors, proximity sensor measurements using a proximity sensor, information display functions implemented using status indicators such as light-emitting-diode status indicators, touch event measurements using a touch sensor, functions associated with displaying information on multiple (e.g., layered) displays, operations associated with performing wireless communications functions, operations associated with gathering and producing audio signals, control operations associated with gathering and processing button press event data, and other functions in device 10.

Input-output circuitry 42 may be used to allow data to be supplied to device 10 and to allow data to be provided from device 10 to external devices. Input-output circuitry 42 may include sensors 32. Sensors 32 may include ambient light sensors, light-based and capacitive proximity sensors, touch sensors (e.g., light-based touch sensors and/or capacitive touch sensors that are part of a touch screen display or that are implemented using stand-alone touch sensor structures), accelerometers, and other sensors.

Input-output circuitry 42 may also include one or more displays such as display 14. Display 14 may be a liquid crystal display, an organic light-emitting diode display, an electronic ink display, a plasma display, a display that uses other display technologies, or a display that uses any two or more of these display configurations. Display 14 may include an array of touch sensors (i.e., display 14 may be a touch screen). The touch sensors may be capacitive touch sensors formed from an array of transparent touch sensor electrodes such as indium tin oxide (ITO) electrodes or may be touch sensors formed using other touch technologies (e.g., acoustic touch, pressure-sensitive touch, resistive touch, optical touch, etc.).

Audio components 36 may be used to provide device 10 with audio input and output capabilities. Examples of audio components that may be included in device 10 include speakers, microphones, buzzers, tone generators, and other components for producing and detecting sound.

Communications circuitry 38 may be used to provide device 10 with the ability to communicate with external equipment. Communications circuitry 38 may include analog and digital input-output port circuitry and wireless circuitry based on radio-frequency signals and/or light. Wireless circuitry in communications circuitry 38 may include radio-frequency transceiver circuitry, power amplifier circuitry, low-noise amplifiers, switches, filters, and antennas. Wireless communications circuitry in circuitry 38 may, for example, include circuitry for supporting near field communications (NFC) by transmitting and receiving near-field-coupled electromagnetic signals. For example, circuitry 38 may include a near field communications antenna and a near field communications transceiver. Circuitry 38 may also include a cellular telephone transceiver and antennas, wireless local area network transceiver circuitry and antennas, etc.

Device 10 may also include a battery, power management circuitry, and other input-output devices 40. Input-output devices 40 may include buttons, joysticks, click wheels, scrolling wheels, touch pads, key pads, keyboards, cameras, light-emitting diodes and other status indicators, etc.

A user can control the operation of device 10 by supplying commands through input-output circuitry 42 and may receive status information and other output from device 10 using the output resources of input-output circuitry 42.

Figure 3:
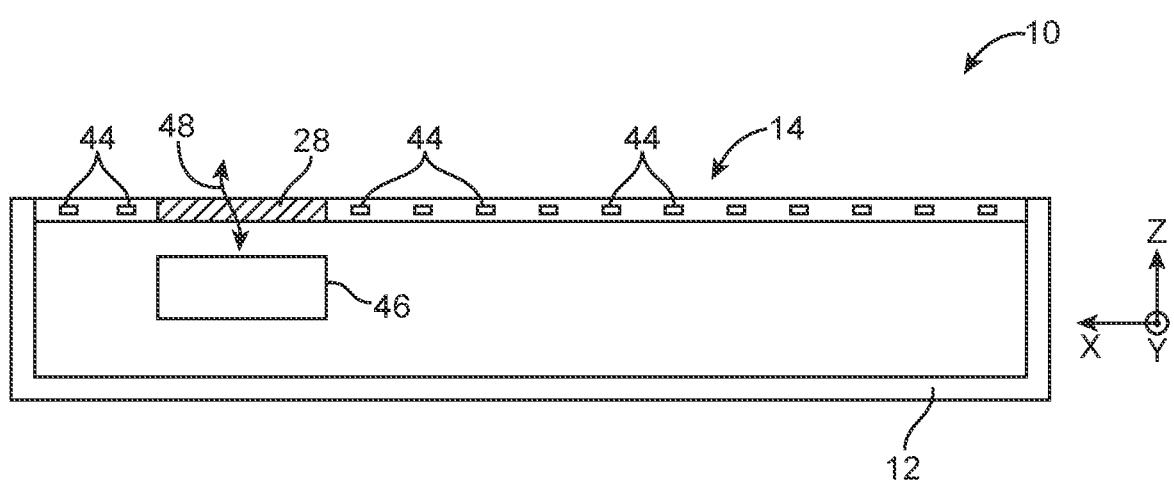
FIG. 3 is a cross-sectional side view of an illustrative electronic device having a display with an opening to accommodate signals associated with an internal electronic component in the device in accordance with an embodiment of the present invention.

FIG. 3 is a cross-sectional side view of an illustrative device having a display with an opening. As shown in FIG. 3, device 10 may have a housing such as housing 12 in which display 14 is mounted. Display 14 may be an organic light-emitting diode display (e.g., a thin flexible display having a thickness of 100 microns or less, 500 microns or less, or other suitable thickness) or may implemented using other display technologies. Display 14 may cover some or all of the front surface of device 10 or may be mounted in housing 12 so that other portions of device 10 are covered by display 14.

One or more openings such as opening 28 of FIG. 3 may be formed in display 14. In particular, one or more openings such as opening 28 may be formed in the active region of display 14. When formed in the active region of display 14, opening 28 will generally be surrounded by display pixels in display 14 such as illustrative display pixels 44. In particular, opening 28 will be surrounded by display pixels 44 lying in the same plane as opening 28, (i.e., the X-Y plane in the example of FIG. 3). Display pixels 44 may be, for example, organic light-emitting diode display pixels.

Electrical components such as component 46 may be mounted in housing 12. For example, component 46 may be mounted in lateral alignment with opening 28 (i.e., component 46 may be mounted in under opening 28 in the orientation of FIG. 3 so that component 46 and opening 28 are aligned along lateral dimensions X and Y and lie along a common axis in dimension Z). With this type of configuration, opening 28 may overlap component 46 sufficiently that signals 48 that are associated with the operation of component 46 may pass through opening 28.

If desired, component 46 may be larger than opening 28 or component 46 may be smaller than opening 28. A single component 46 may also span multiple openings 28 and/or a single opening 28 may span multiple components 46. Signals 48 may include acoustic signals (sound), electromagnetic signals such as radio-frequency electromagnetic signals, and light (e.g., visible and/or infrared light). In the example of FIG. 3, device 10 is shown as having a single opening 28 and a single associated internal electronic device component 46. This is merely illustrative. Device 10 may have one or more openings 28 and one or more components 46 that operate using signals 48 that pass through the openings.

Figure 4:
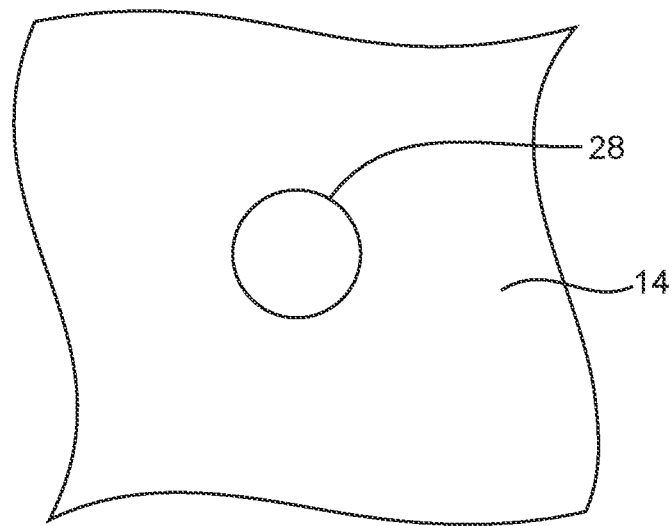
FIG. 4 is a top view of a portion of an illustrative display having an opening in accordance with an embodiment of the present invention.
Figure 5:
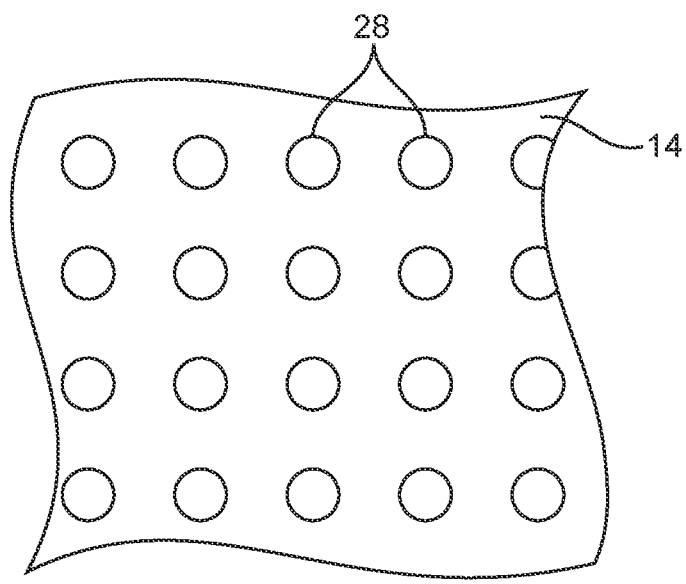
FIG. 5 is a top view of a portion of an illustrative display having multiple openings with curved edges organized in an array of rows and columns in accordance with an embodiment of the present invention.

FIG. 4 is a top view of a portion of display 14 in a configuration in which display 14 has a single opening 28. In the example of FIG. 5, display 14 has multiple openings 28 that form an array having multiple rows and columns. Each row and each column in the array of FIG. 5 may contain multiple openings 28. Other configuration such as configurations in which openings 28 have a random pattern or other irregular pattern may be used if desired. Openings 28 in the illustrative configurations of FIGS. 4 and 5 have circular shapes, but may, in general, have any suitable shapes (e.g., shapes with curved edges, shapes with straight edges, shapes with combinations of curved and straight edges, squares, hexagons, rectangles, ovals, circles, etc.). In displays with multiple openings 28 the openings may be equal in size or may have different sizes.

Figure 6:
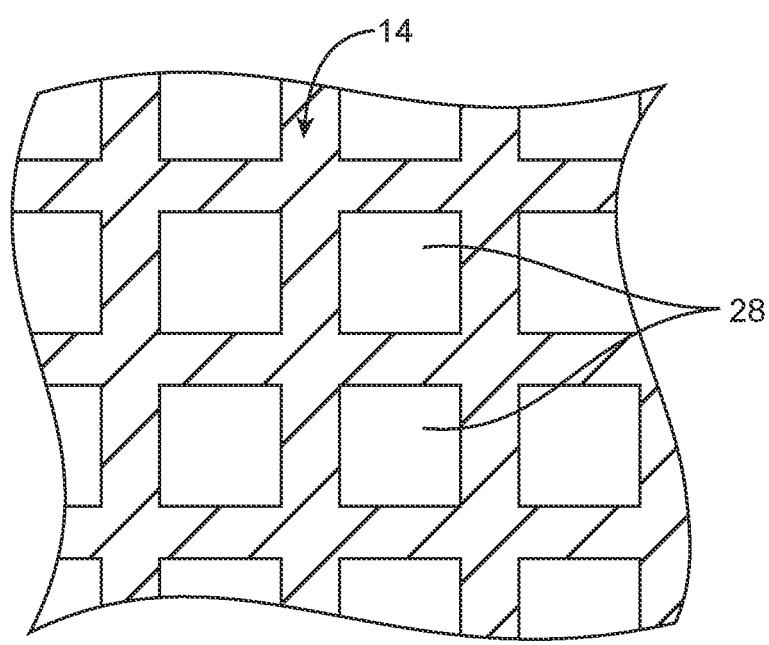
FIG. 6 is a top view of a portion of an illustrative display having multiple openings with straight edges organized in an array of rows and columns in accordance with an embodiment of the present invention.
Figure 7:
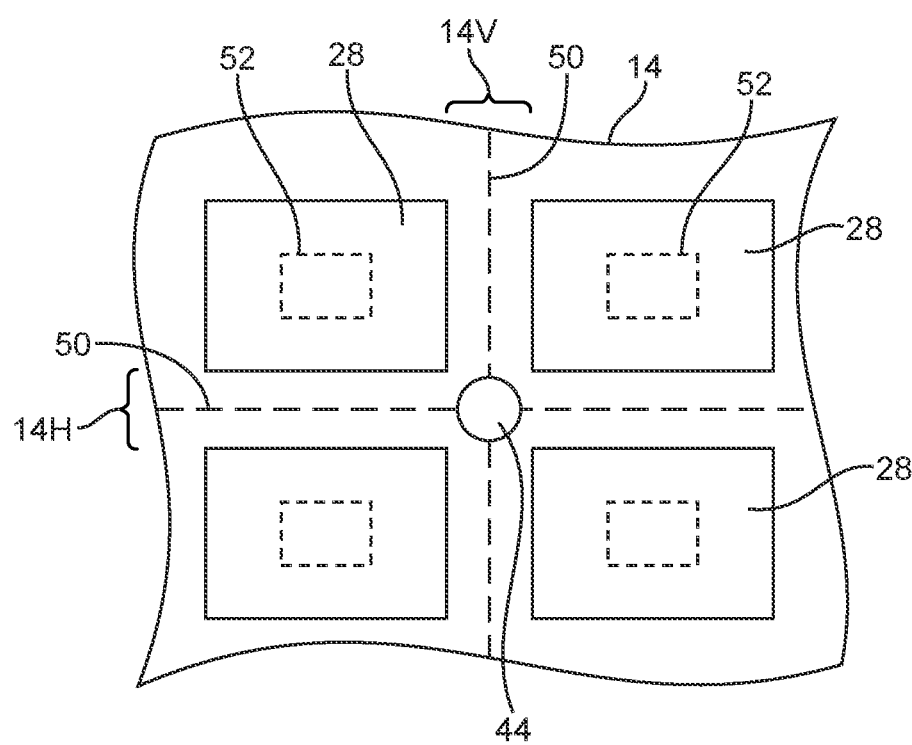
FIG. 7 is a top view of a portion of an illustrative display having an array of rectangular openings and display pixel structures and interconnects formed on structures surrounding the openings in accordance with an embodiment of the present invention.

As shown in FIG. 6, display 14 may have an array of rectangular openings 28. In this type of arrangement, the portions of display 14 that have not been removed to create openings 28 form a grid shape. A grid-shaped display layer (i.e., a display formed from intersecting vertical and horizontal strips of display structures such as display substrate layer structures) may be used to display images for a user. As shown in FIG. 7, for example, display pixels 44 may formed on and supported by portions of display 14 that remain after removing display structures to form openings 28. Display pixels 44 may, for example, be formed at or near the intersection between vertical strip portions 14V of display 14 and horizontal strip portions 14H of display 14. Electrical interconnects 50 may be formed on portions of display 14. Electrical interconnects 50 may include portions that run vertically along strip portions 14V of display 14 and portions that run horizontally along strip portions 14H of display 14. The horizontal and vertical conductive lines in interconnects 50 may be used to distribute data and control signals to an array of display pixels 44 in display 14.

The presence of openings such as rectangular openings 28 of FIG. 7 in display 14 may allow an additional display to be mounted underneath display 14. As shown in FIG. 7, for example, an additional display having additional display pixels 52 may be mounted under display 14 so that that display pixels 52 in the additional display are visible by a user of device 10 through openings 28. Display pixels 52 may be pixels in an organic light-emitting-diode display, pixels in an electronic ink display, pixels in a liquid crystal display, pixels in a plasma display, or pixels in other suitable types of displays.

Figure 8:
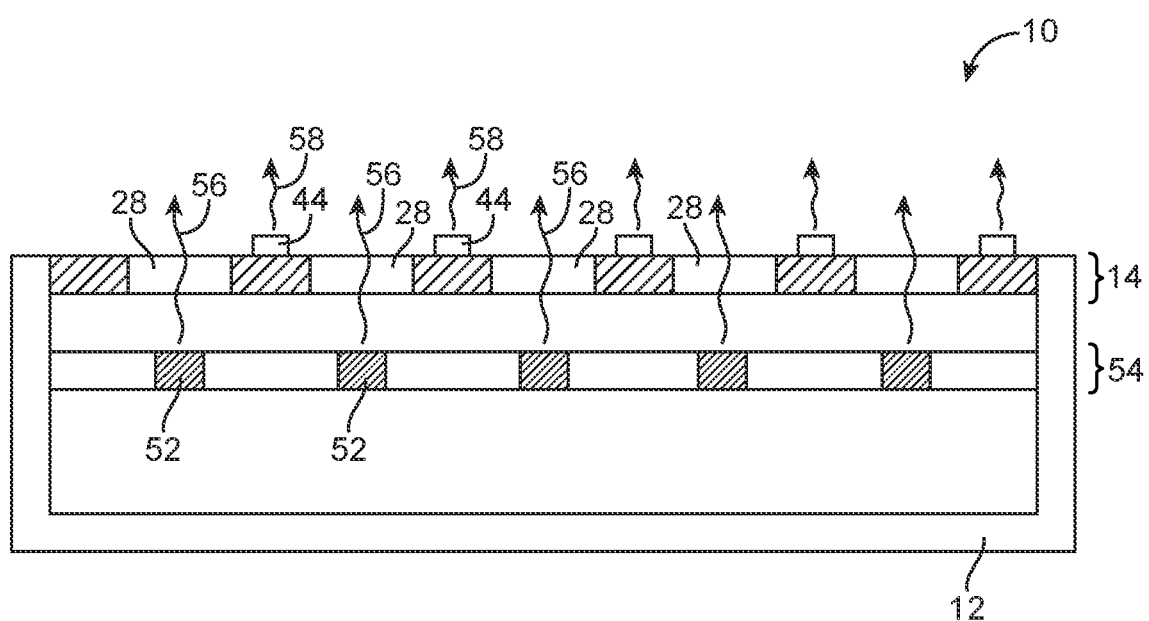
FIG. 8 is a cross-sectional side view of an illustrative upper display with openings through which display pixels on a lower display may be viewed in accordance with an embodiment of the present invention.

A cross-sectional side view of a device having this type of configuration is shown in FIG. 8. As shown in FIG. 8, display 14 of FIG. 7 may serve as an upper display and display 54 may serve as a lower display. Display 14 may have openings 28 that are aligned with (i.e., that overlap) corresponding display pixels 52 in display 54. This allows display pixel light 56 that is produced by display pixels 52 in display 54 to pass through openings 28 in display 14 for viewing by a user of device 10. Display 14 may have display pixels such as display pixels 44 that are formed using the portions of display 14 that have not been removed to form openings 28. Display pixels 44 may emit display light 56. In the example of FIG. 8, display pixels 44 are shown as being formed on the upper surface of display 14. This is merely illustrative. Display pixels 44 may be formed from structures that are embedded within the layers of display 14 or may be formed using other suitable display arrangements.

A dual layer display system of the type shown in FIG. 8 may use one or both of displays 14 and 54 in displaying information for a user. For example, in a first mode of operation, display 14 may be active and display 54 may be inactive, in a second mode of operation, display 14 may be inactive and display 54 may be active, and in an optional third mode, displays 14 and 54 may be simultaneously active. When display 14 is active and display 54 is inactive, display pixels 44 may be used to display images to the user, whereas display pixels 52 may be inactivated to conserve power. When display 54 is active and display 14 is inactive, display pixels 52 may be used to display images to the user through openings 28 in display layer 14 while display pixels 44 may be inactivated to conserve power. If desired, display pixels 52 and 44 may be used simultaneously.

Control circuitry such as storage and processing circuitry 30 of FIG. 2 may control the operation of displays 14 and 54. Decisions as to which display(s) to activate to use in displaying images to the user of device 10 may be made by the control circuitry in device 10 in real time based on criteria such as power consumption criteria, criteria such as image quality criteria (e.g., desired display resolution, display contrast, display brightness), operating environment (e.g., high or low ambient light conditions), the nature of displayed content (e.g., whether device 10 is displaying text associated with a book or other document, whether device 10 is displaying video, whether device 10 is displaying black and white content or is displaying color information, whether device 10 is displaying content that is moving rapidly such as game content or is displaying content that moves slowly such as web page content without video, etc.), or other suitable criteria.

With one illustrative configuration, display 14 may be a thin flexible display such as an organic light-emitting-diode display and display 54 may be a display that is capable of consuming less power during operation than display 14. For example, display 54 may be a liquid crystal display or an electronic ink display. With this type of dual layer display configuration, display 14 may be used for periods of time when the attributes of display 14 are desired (brightness, resolution, contrast, color accuracy, absence of motion artifacts, etc.) and when the higher power consumption of display 14 is acceptable and display 54 may be used when the attributes of display 54 are desired (e.g., lower potential power consumption with acceptable or preferably image display attributes such as brightness, resolution, contrast, etc.).

Figure 9:
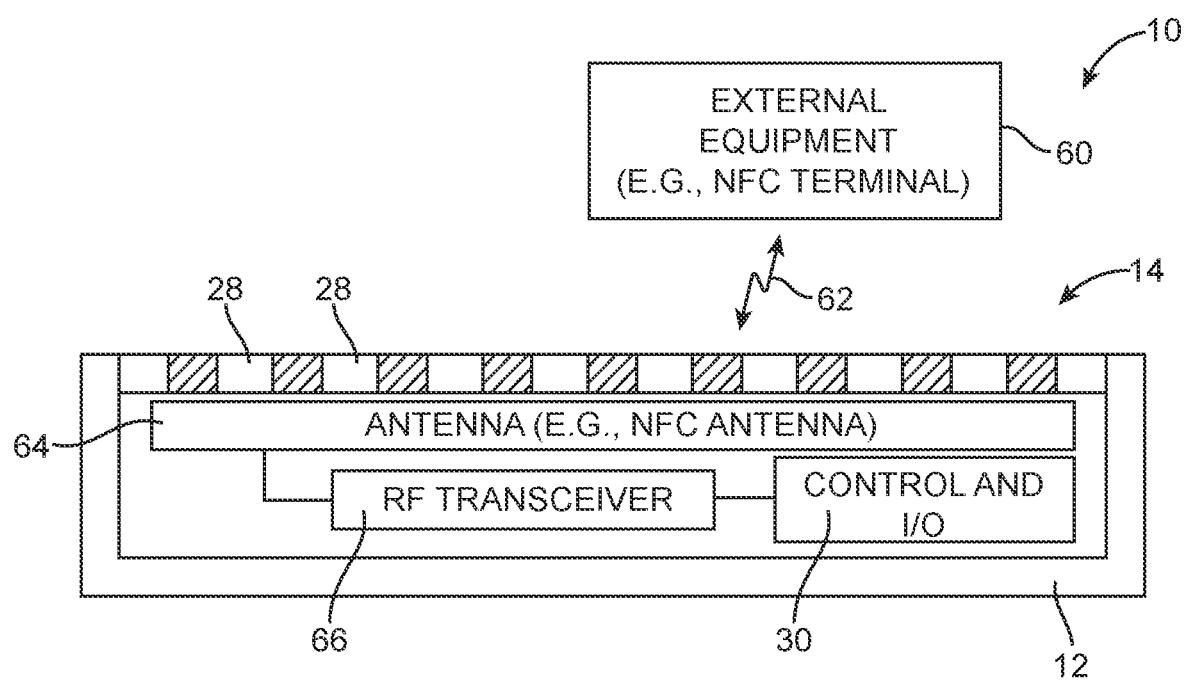
FIG. 9 is a cross-sectional side view of an illustrative device with a display that has openings and an antenna mounted under the openings to communicate with external wireless equipment in accordance with an embodiment of the present invention.

As shown in FIG. 9, antenna structures 64 may be mounted under openings 28 in display 14. Openings 28 may be transparent to radio-frequency signals, so radio-frequency signals 62 may pass through display 14.

Antenna structures 64 may include one or more antennas. Examples of antennas that may be included in antenna structures 64 include near field communications antennas (e.g., antennas designed for communications using near-field-coupled electromagnetic signals conveyed over relatively short distances such as distances of 5 cm or less, 4 cm or less, or 2 cm or less), cellular telephone antennas, and local wireless area network antennas.

Control circuitry 30 (e.g., storage and processing circuitry 30 of FIG. 2) may be used to supply data to be transmitted to radio-frequency transceiver 66 and may be used to receive incoming data from radio-frequency transceiver 66. Radio-frequency transceiver 66 may use antenna structures 64 to transmit radio-frequency signals 62 to external equipment 60 and may use antenna structures 64 to receive radio-frequency signals 62 from external equipment 60.

In near field communications scenarios, external equipment 60 may be a near field communications terminal at a store or other establishment, signals 62 may be conveyed between equipment 60 and device 10 over a relatively short distance (e.g., using electromagnetic near field coupling when device 10 and equipment 60 are separated by a distance of 5 cm or less, 4 cm or less, or 2 cm or less), and radio-frequency transceiver circuitry 66 may include near field communications radio-frequency transceiver circuitry. In other types of wireless communications schemes, radio-frequency transceiver circuitry 66 such as wireless local area network transceiver circuitry and/or cellular telephone transceiver circuitry and one or more associated antennas 64 may be used to communicate with external equipment 60 that is located farther from device 10 (e.g., 1 m or more, 10 m or more, 100 m or more, or 1000 m or more).

Figure 10:
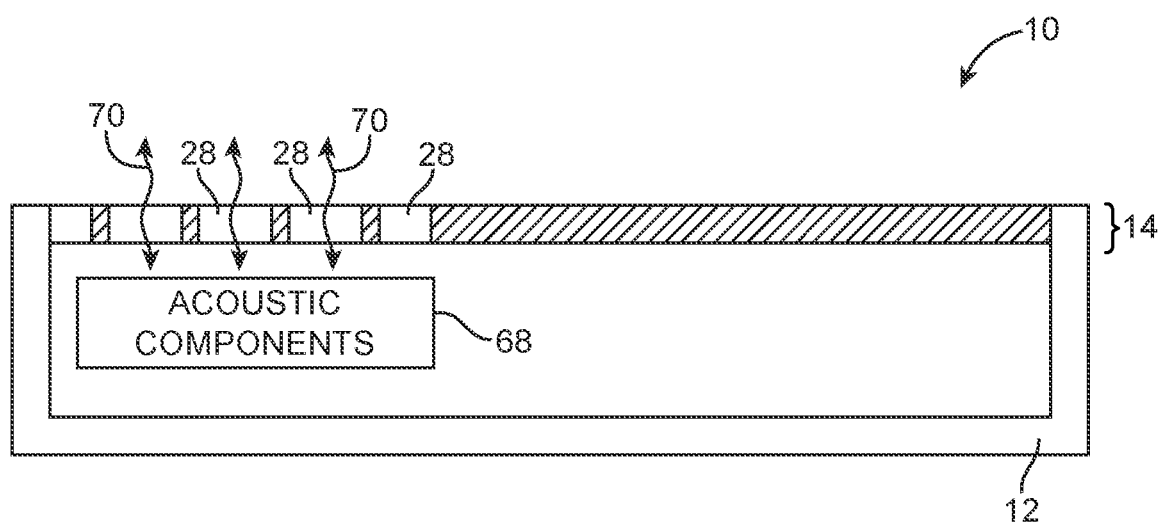
FIG. 10 is a cross-sectional side view of an illustrative electronic device having a display with openings through which acoustic signals associated with one or more acoustic components may pass in accordance with an embodiment of the present invention.

If desired, openings 28 may be used to allow acoustic signals (sound) to exit or enter device 10. As shown in FIG. 10, for example, display 14 may be provided with one or more openings 28 through which acoustic signals 70 may pass. One or more acoustic components 68 may be mounted adjacent to openings 28. Acoustic components 68 may include microphones for gathering incoming sound through openings 28. Acoustic components 68 may also include speakers, vibrators, tone generators, buzzers, and other components for generating sound that exits device 10 and housing 12 through openings 28. Arrangements in which microphones and sound-generating components are both mounted under openings 28 may be used or components 68 may include only microphone structures or only sound-generating structures.

Figure 11:
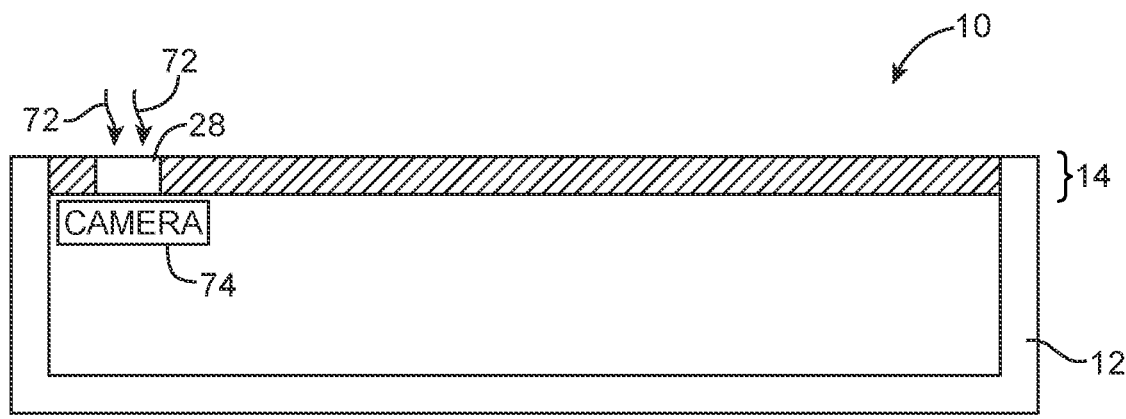
FIG. 11 is a cross-sectional side view of an illustrative electronic device having a display with an opening that allows light to reach a camera in accordance with an embodiment of the present invention.

FIG. 11 is a cross-sectional side view of an illustrative electronic device in which a camera is mounted adjacent to an opening in a display. As shown in FIG. 11, camera 74 may be mounted in lateral alignment with opening 28 in display 14. During operation of device 10, image light 72 for camera (image sensor) 74 may be received by camera 74 through opening 28. Opening 28 of FIG. 11 and the other drawings may, if desired, be formed in an active region of display 14 such as active region 22.

Figure 12:
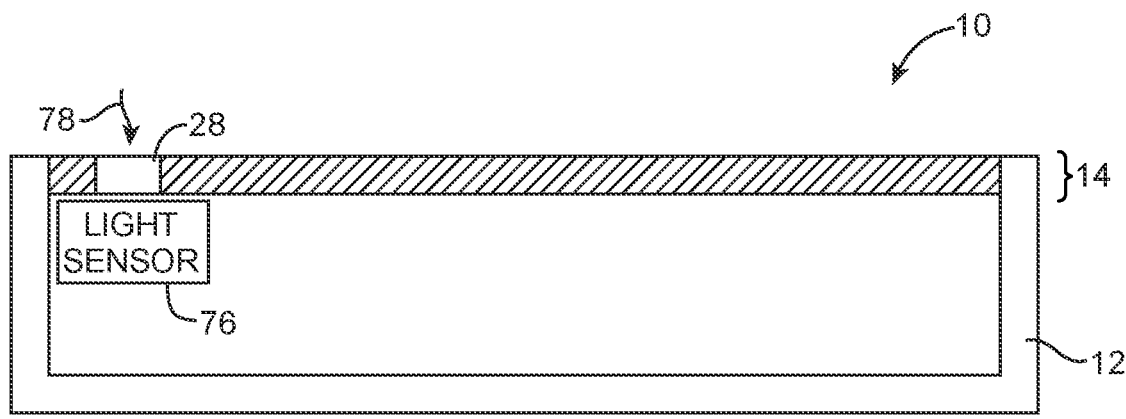
FIG. 12 is a cross-sectional side view of an illustrative electronic device having a display with an opening that allows light to reach a light sensor in accordance with an embodiment of the present invention.

FIG. 12 is a cross-sectional side view of an illustrative electronic device in which a light sensor is mounted adjacent to an opening in a display. As shown in FIG. 12, light sensor 76 may be mounted in lateral alignment with opening 28 so that light 78 may reach light sensor 76 through opening 28. If desired, light 78 may reach light sensor 76 through multiple openings 28 in parallel. Light sensor 76 may be a photodiode, phototransistor, a light detector formed from an integrated circuit, a light detector formed from a discrete packaged device, a visible light sensor, an infrared light sensor, or other suitable light sensor. Light 78 may be, for example, ambient light that is indicative of the amount of brightness in the vicinity of device 10. Light sensor 76 may be and ambient light sensor that is used in measuring light 78.

Control circuitry 30 may use ambient light sensor measurements from ambient light sensor 76 in taking suitable actions in device 10. For example, control circuitry 30 may increase the brightness of display 14 when ambient light sensor readings from ambient light sensor 76 indicate that device 10 is being used in a bright environment and/or may decrease the brightness of display 14 when ambient light sensor readings from ambient light sensor 76 indicate that device 10 is being used in a dim environment.

Figure 13:
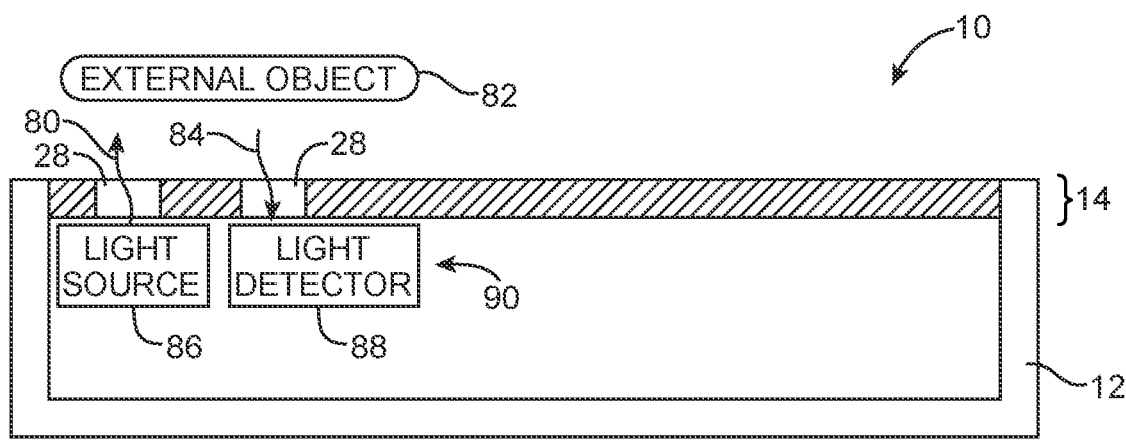
FIG. 13 is a cross-sectional side view of an illustrative electronic device having a display with openings to accommodate a light-based proximity sensor in accordance with an embodiment of the present invention.

FIG. 13 is a cross-sectional side view of an illustrative electronic device in which a light-based proximity sensor is mounted adjacent to one or more openings in a display. As shown in FIG. 13, proximity sensor 90 may include a light source such as light source 86 and may include a light detector such as light detector 88. Light source 86 may be formed from a light-emitting diode such as an infrared light-emitting diode or other device that produces light 80. Light source 86 may emit light 80 (e.g., infrared light or visible light). Emitted light 80 may pass through opening 28 in display 14. Emitted light 80 that has passed through opening 28 may reflect off of an external object such as external object 82 when external object 82 is in the vicinity of device 10 (e.g., less than 10 cm away, less than 3 cm away, or less than 1 cm away). Reflected light 84 may pass through opening 28 and may be received by light detector 88.

Light detector 88 may be a semiconductor device such as a photodiode or phototransistor and may be used in measuring the magnitude of reflected light 84. When the magnitude of reflected light 84 is relatively low, device 10 can conclude that no external object is in the vicinity of proximity detector 90 and device 10. When the magnitude of reflected light 84 is relatively high, device 10 can conclude that an external object such as external object 82 (e.g., the user's head or other body part) is in close proximity to proximity sensor 90 and device 10. Device 10 can take appropriate actions in response to detection of an external object in the vicinity of device 10. For example, device 10 can temporarily deactivate touch sensor functionality in display 14 to avoid unintended input.

Figure 14:
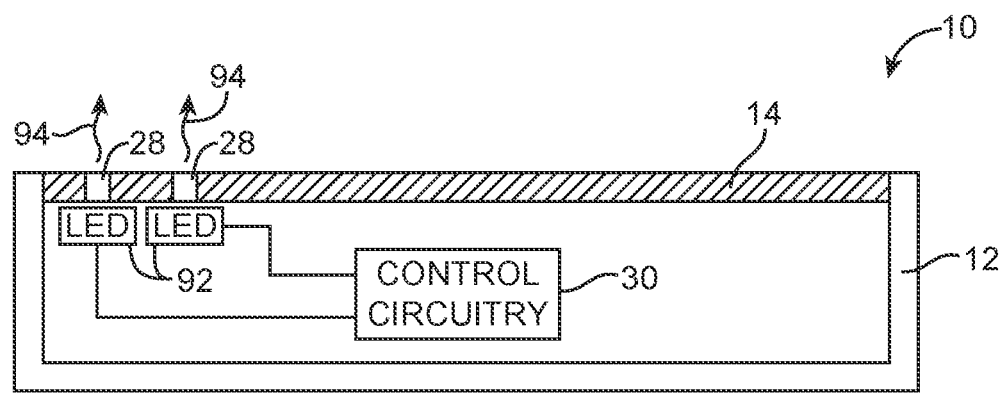
FIG. 14 is a cross-sectional side view of an illustrative electronic device having a display with openings to accommodate emitted light from light-emitting-diode status indicators in accordance with an embodiment of the present invention.

In the illustrative configuration of FIG. 14, device 10 has been provided with internal status indicator light sources such as light-emitting diodes 92. Control circuitry 30 may provide control signals to light-emitting diodes 92 to turn light-emitting diodes 92 on and off and to control the brightness of light-emitting diodes 92. When turned on, light-emitting diodes 92 may be used to emit status indicator light 94 that passes through openings 28 in display 14. Status indicator light 94 may be indicative of the operational status of device 10. Examples of device functions having operating status that may be reflected by the states of status indicator light-emitting diodes 92 include power functions (power on/off states), audio volume functions (e.g., current volume level or mute on or off), port functions (I/O connector plugged in or not plugged in), wireless communications circuitry functions (active/inactive), display brightness (brightness level or on/off), etc.

Figure 15:
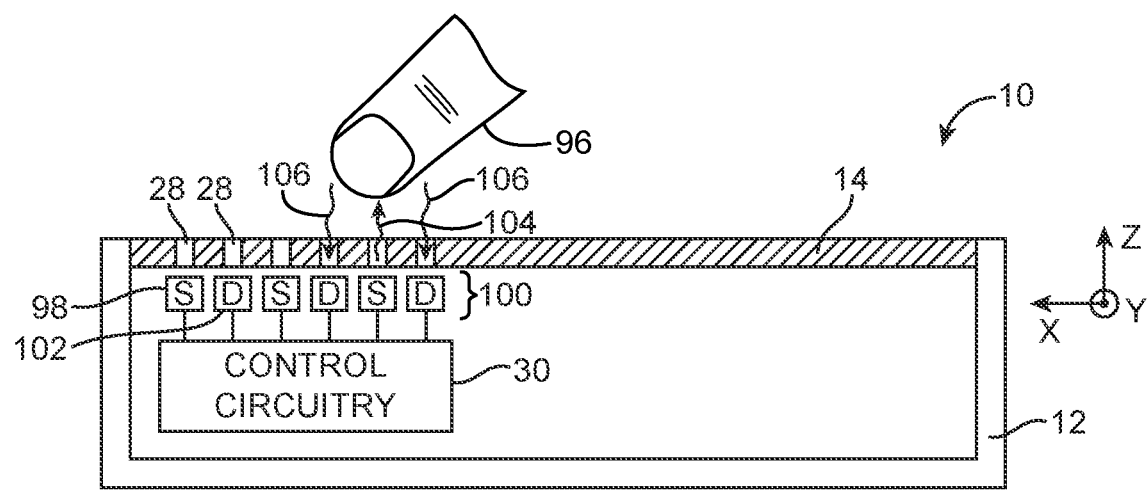
FIG. 15 is a cross-sectional side view of an illustrative electronic device having a display with openings through which light associated with a light-based touch sensor may operate in accordance with an embodiment of the present invention.

If desired, openings 28 in display 14 may be used to facilitate formation of a light-based touch sensor. A light-based touch sensor array that is capable of ascertaining the position of a user's finger or other external object in lateral dimensions X and Y may be formed using an array of light emitters and light detectors formed under display 14. An illustrative configuration that may be used for device 10 to form a light-based touch sensor under display 14 is shown in FIG. 15. As shown in FIG. 15, display 14 may be provided with an array of openings 28. There may be, for example, rows and columns of openings 28 in a two-dimensional array that spans some or all of the active area of display 14. In the example of FIG. 15, the array of openings formed in display 14 covers only part of display 14. This is, however, merely illustrative. Openings 28 may be arranged in an array that covers substantially all of the surface area of display 14 if desired. There may be any suitable number of openings 28 in the array (e.g., ten or more, one hundred or more, one thousand or more, etc.). Each row and column in the array may have five or more openings, ten or more openings, one hundred or more openings, etc.). Each opening may be surrounded by display pixels.

Light-based touch sensor array 100 may include light sources 98 and light detectors 102. Light sources 98 may be laterally aligned with respective openings 28 and light detectors 102 may be aligned with respective openings 28. In particular, light sources 98 may be arranged in a two-dimensional array under corresponding openings 28 and light detectors 102 may be arranged in a two-dimensional array under corresponding openings 28. For example, sources 98 and detectors 102 may be arranged in a checkerboard pattern or other pattern that intersperses light sources 98 among light detectors 102. Light sources 98 may be formed from light-emitting diodes (e.g., visible or infrared light-emitting diodes) or other sources of light. Light detectors 102 may be formed from semiconductor light sensor components such as silicon photodiodes, phototransistors, etc.

During operation, sources 98 may emit light 104. Light 104 may pass through openings 28. When no external objects are present in the vicinity of touch sensor 100, light 104 will not be reflected towards detectors 102 in sensor 100. When, however, an external object such as a user's finger or other object 96 is present in the vicinity (e.g., less than 2 cm, less than 0.5 cm, less than 0.1 cm, etc.) of one or more of light emitters 98, some of light 104 may be reflected back towards touch sensor 100 as reflected light 106. Reflected light 106 may pass through openings 28 in display 14 and may be received by detectors 102 in light-based touch sensor 100.

Control circuitry 30 may process received light signal strength data from light sensors 102 in light-based touch sensor 100. For example, control circuitry 30 may determine the X and Y location at which reflected light magnitude is greatest and thereby determine the location of object 96. Signal strength interpolation and other processing schemes may be used to enhance X and Y resolution. By using reflected light measurements through openings 28 to determine the location of eternal object 96 in dimensions X and Y, an arrangement of the type shown in FIG. 15 may be used to provide display 14 with touch sensing capabilities.

Figure 16:
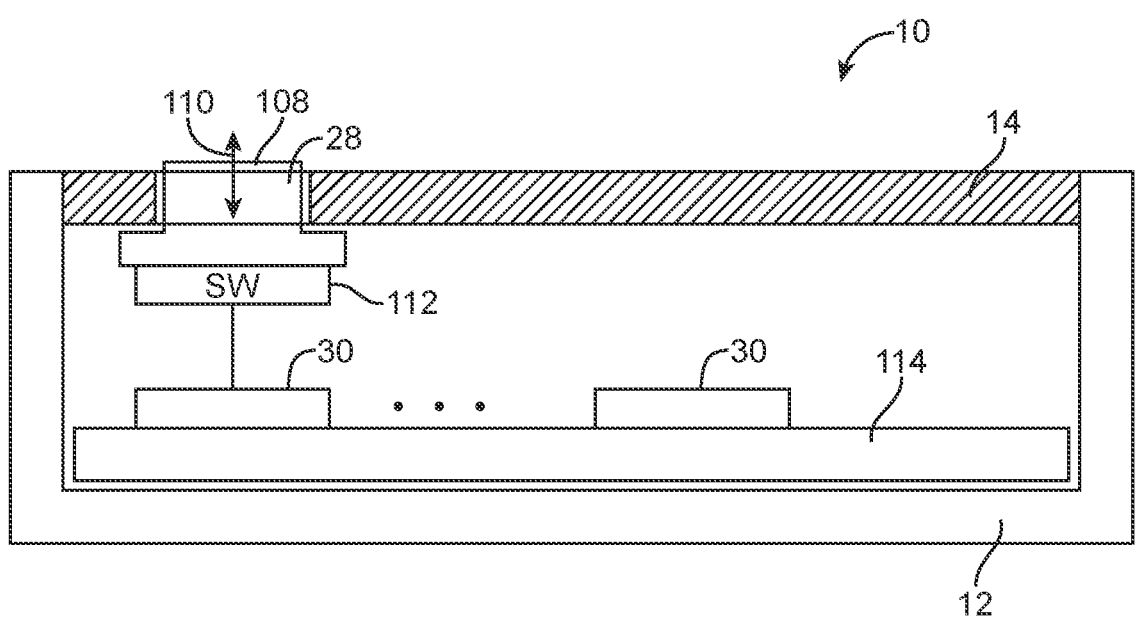
FIG. 16 is a cross-sectional side view of an illustrative electronic device having a display with an opening to accommodate a moving member such as a button member in accordance with embodiment of the present invention.

FIG. 16 is a cross-sectional side view of an illustrative configuration that may be used for electronic device 10 when it is desired to allow moving members to travel within openings 28. In the example of FIG. 16, device 10 has control circuitry 30 formed from one or more internal components mounted on a substrate such as substrate 114. Substrate 114 may be, for example, a printed circuit board substrate. Printed circuit board substrate 114 may be formed from a rigid printed circuit board material such as fiberglass-filled epoxy (e.g., FR4) or a flexible printed circuit board substrate such as a sheet of polyimide or other polymer (e.g., a flex circuit). Control circuitry 30 may be used to control the operation of one or more buttons or other input-output components with moving members. In the example of FIG. 16, a button has been provided in device 10 that has a button member such as button member 108 that travels vertically in up and down directions 110 within opening 28 in display 14. When pressed inwardly by a user's finger or other object, button member 108 may press against switch 112. When button member 108 is not pressed inwardly, switch 112 may bias button member 108 outwardly (i.e., vertically upward in the configuration of FIG. 16). Control circuitry 30 can monitor the status of switch 112 (e.g., open/closed) to determine the state of the button.

Figure 17:
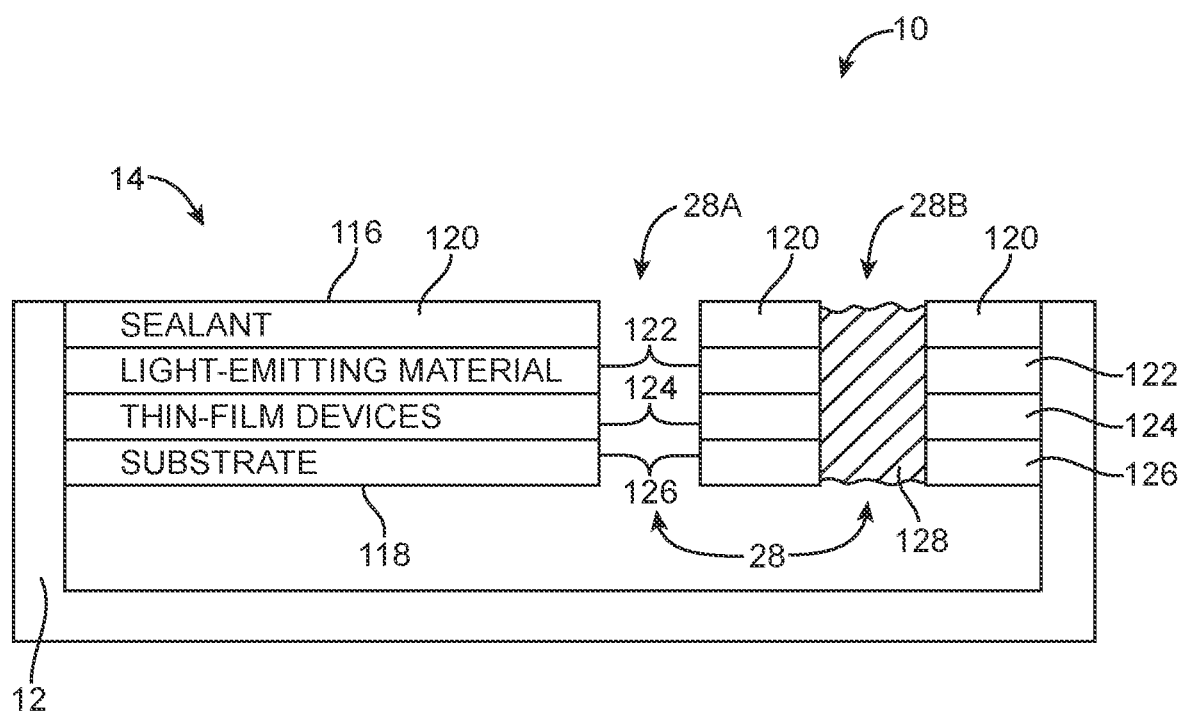
FIG. 17 is a cross-sectional side view of an illustrative electronic device having a display with an opening that is filled with air and an opening that is filled with a material such as a clear window material in accordance with an embodiment of the present invention.

Display 14 may be formed from one or more layers of material. For example, when implemented as a liquid crystal display, display 14 may include upper and lower polarizer layers and, sandwiched between the upper and lower polarizer layers, may include a thin-film transistor layer, a layer of liquid crystal material, and a color filter layer. In the example of FIG. 17, display 14 has been implemented using an organic light-emitting diode design. As shown in FIG. 17, display 14 may have an upper (outermost) surface such as surface 116 and may have a lower (innermost) surface such as surface 118. One or more layers of material may be interposed between surfaces 116 and 118. Openings 28 (e.g., left-hand opening 28A and right-hand opening 28B in the FIG. 17 example) may pass completely through display 14 from upper surface 116 to lower surface 118 (as an example). Configurations in which recesses are formed partway through the layers of display 14 may also be used to facilitate the passage of signals through display 14, if desired.

Organic light-emitting diode display 14 of FIG. 17 may have a thickness (vertical dimension) of about 200 microns or less, 100 microns or less, or other suitable thickness. Cover glass layers may, if desired, be omitted from device 10 as shown in FIG. 17 to reduce weight and ensure that device 10 is compact. A substrate such as substrate 126 may serve as a supporting layer for other display layers in display 14. Substrate 126 may be formed from a thin flexible sheet of material such as a polyimide layer or a sheet of other polymer material (as examples). Thin-film devices 124 may be formed on substrate 126. Thin-film devices 124 may include thin-film circuitry such as thin-film transistors (e.g., polysilicon and/or amorphous silicon transistors), conductive interconnects (e.g., interconnect lines formed from patterned metal, pattered indium tin oxide or other patterned transparent conductive materials, or other conductive structures), and other circuitry. Organic light-emitting material such as material 122 may be formed on top of thin-film devices 124. An encapsulating layer such as sealant layer 120 may be used to encapsulate and protect the layer of organic light-emitting material and other underlying structures in display 14.

As shown in FIG. 17, openings such as opening 28A may pass through the layers of display 14 to form a passageway between the interior of device 10 and the exterior of device 10. Openings 28 such as opening 28A may be filled with air and may be used to convey acoustic signals, radio-frequency signals, and light. If desired, some openings 28 in display 14 such as opening 28B may be filled with a material other than air. For example, opening 28B may be filled with material 128 such as glass, polymer, ceramic, multiple materials such as these, or other suitable materials.

Material 128 may be a radio-transparent material that allows radio-frequency signals to be transmitted and received through opening 28B. Material 128 may be clear (e.g., transparent in the visible and/or infrared portions of the light spectrum) to allow light to be transmitted and received through opening 28B. Colored materials may also be used in implementing material 128 (e.g., to provide optical filtering capabilities to opening 28B).

Figure 18:
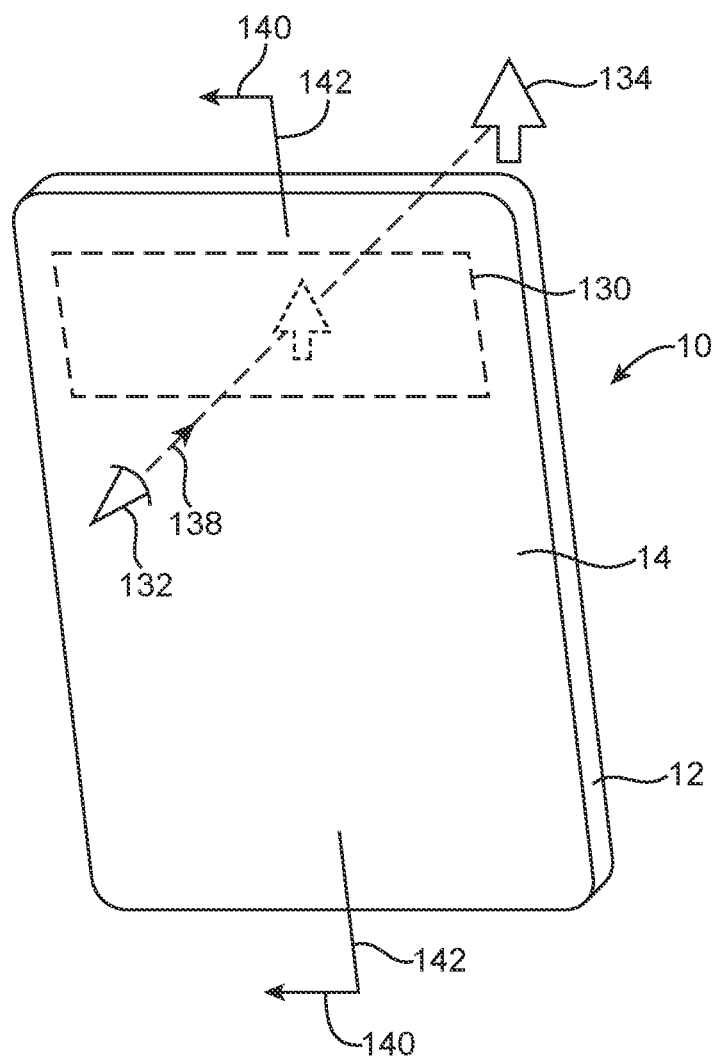
FIG. 18 is a perspective view of an illustrative electronic device having a transparent window region of the type that may be formed from an opening or openings in a display in accordance with an embodiment of the present invention.

If desired, device 10 may be provided with one or more transparent window portions. As shown in FIG. 18, for example, device 10 may be provided with a transparent portion such as window 130. Window 130 may be formed by creating transparent window regions in the front and rear surfaces of device 10. The rear window opening may, for example, be formed from a clear glass plate or other transparent structure. The front window opening may be formed from an array of openings 28 in display 14 or from a single larger opening 28 in display 14.

During operation of a device such as device 10 of FIG. 18, a user (depicted as viewer 132 of FIG. 18) may view an object such as object 134 by looking through window 130 in direction 138. Display 14 may have display pixels that are located within window 130. These pixels may be activated as a user views object 134 through window 130 to form a heads-up display in which an image is displayed by the display pixels while the external object is simultaneously visible to the user of device 10.

Figure 19:
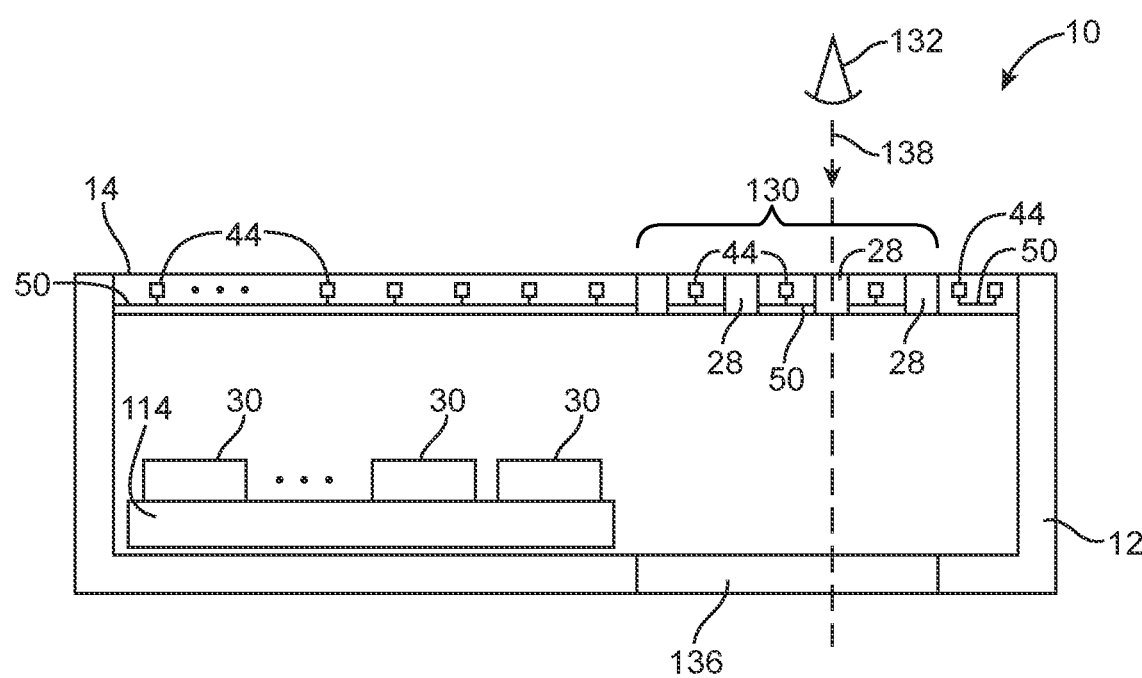
FIG. 19 is a cross-sectional side view of the illustrative electronic device of FIG. 18 in accordance with an embodiment of the present invention.

A cross-sectional side view of device 10 of FIG. 18 taken along line 142 and viewed in direction 140 is shown in FIG. 19. As shown in FIG. 19, display 14 may have openings 28 that provide a portion of display 14 with sufficient transparency to form window 130. In the example of FIG. 19, openings 28 are organized in an array in part of the active region of display 14 and are interspersed among display pixels 44 and interconnects 50 in display 14. If desired, openings 28 (or one or more larger openings 28) may be formed in other portions of display 14 (e.g., inactive portions of display 14). The arrangement of FIG. 19 is merely illustrative.

Housing 12 may have a rear housing window structure such as window 136. Window 136 may be formed from clear glass, clear plastic, or other suitable transparent structures. Control circuitry 30 may be implemented using components mounted on a substrate such as printed circuit 114. During operation, control circuitry 30 can control images displayed on display 14 within window region 130, so that window region 130 serves as a heads-up display. With this type of configuration, viewer 132 may view external objects such as object 134 through window 130 and corresponding rear window 136 by looking in direction 138. At the same time that a user is viewing object 134 through windows 130 and 136, control circuitry 30 may display images on display 14 using display pixels 44 in window 130. The images that are displayed may relate to the user's current surroundings, may relate to camera information (e.g., when the heads-up display is used as a camera viewfinder), or other suitable information.

The foregoing is merely illustrative of the principles of this invention and various modifications can be made by those skilled in the art without departing from the scope and spirit of the invention.

What is claimed is:

1. An electronic device, comprising:
a housing;
a display mounted in the housing, wherein the display has an active area with an array of organic light-emitting diode pixels and an inactive area that at least partially surrounds the active area;
an acoustic component mounted behind a portion of the active area of the display.

2. The electronic device defined in claim 1 wherein the acoustic component comprises a speaker that emits sound through the display.

3. The electronic device defined in claim 1 wherein the display comprises glass that covers the acoustic component.

4. The electronic device defined in claim 1 wherein the acoustic component comprises a vibrator.

5. The electronic device defined in claim 1 wherein the display comprises an opening through which sound from the acoustic component passes.

6. The electronic device defined in claim 5 wherein the opening is part of an array of openings in the display.

7. The electronic device defined in claim 1 wherein the display comprises a polymer substrate.

8. The electronic device defined in claim 7 wherein the polymer substrate comprises opposing first and second surfaces and an opening that passes from the first surface to the second surface.

9. The electronic device defined in claim 8 wherein the acoustic component is aligned with the opening.

10. The electronic device defined in claim 9 wherein display comprises a layer of thin-film transistor circuitry, a layer of organic emissive material, and a layer of sealant, and wherein the opening passes through the layer of thin-film transistor circuitry, the layer of organic emissive material, and the layer of sealant.

11. An electronic device, comprising:
a polymer substrate;
an array of organic light-emitting diode pixels on the polymer substrate that form an active display area; and
a speaker mounted under a portion of the polymer substrate that emits sound through the active display area.

12. The electronic device defined in claim 11 wherein the speaker comprises a vibrator.

13. The electronic device defined in claim 11 wherein the polymer substrate comprises an opening through which the sound passes.

14. The electronic device defined in claim 13 wherein the opening is part of an array of openings in the polymer substrate.

15. The electronic device defined in claim 11 further comprising a microphone that detects sound through the active display area.

16. An electronic device, comprising:
a housing;
an organic light-emitting diode display mounted in the housing, wherein the organic light-emitting diode display has an active area; and
a component mounted behind a portion of the organic light-emitting diode display that emits acoustic waves through the active area of the display.

17. The electronic device defined in claim 16 wherein organic light-emitting diode display comprises glass.

18. The electronic device defined in claim 16 further comprising a microphone that receives sound through the organic light-emitting diode display.

19. The electronic device defined in claim 16 wherein the organic light-emitting diode display comprises a substrate having openings through which the acoustic waves pass.

20. The electronic device defined in claim 16 wherein the component comprises a vibrator.

* * * * *

UNITED STATES PATENT AND TRADEMARK OFFICE
CERTIFICATE OF CORRECTION

| | |
|---|---|
| PATENT NO. | : 11,700,760 B2 |
| APPLICATION NO. | : 17/115547 |
| DATED | : July 11, 2023 |
| INVENTOR(S) | : Benjamin M. Rappoport et al. |

It is certified that error appears in the above-identified patent and that said Letters Patent is hereby corrected as shown below:

In the Claims

Column 14, Line 9-10, "wherein display" should read -- wherein the display --

Signed and Sealed this
Thirtieth Day of January, 2024

*Katherine Kelly Vidal*

Katherine Kelly Vidal
*Director of the United States Patent and Trademark Office*